United States Patent
Lee et al.

(10) Patent No.: US 12,178,145 B2
(45) Date of Patent: Dec. 24, 2024

(54) SEMICONDUCTOR DEVICE INCLUDING HEAT INSULATING LAYER AND METHOD OF MANUFACTURING THE SAME

(71) Applicant: SK hynix Inc., Icheon-si (KR)

(72) Inventors: Woo Cheol Lee, Icheon-si (KR); Won Tae Koo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 150 days.

(21) Appl. No.: 17/894,332

(22) Filed: Aug. 24, 2022

(65) Prior Publication Data

US 2023/0301208 A1 Sep. 21, 2023

(30) Foreign Application Priority Data

Mar. 21, 2022 (KR) ................. 10-2022-0035022

(51) Int. Cl.
*G11C 13/04* (2006.01)
*G11C 13/00* (2006.01)
*H10N 70/00* (2023.01)
*H10N 70/20* (2023.01)

(52) U.S. Cl.
CPC ....... *H10N 70/231* (2023.02); *G11C 13/0004* (2013.01); *H10N 70/023* (2023.02); *H10N 70/063* (2023.02); *H10N 70/066* (2023.02); *H10N 70/841* (2023.02); *H10N 70/8613* (2023.02)

(58) Field of Classification Search
CPC .. H10N 70/231; H10N 70/023; H10N 70/063; H10N 70/066; H10N 70/841; H10N 70/8613; H10N 70/8828; H10N 70/8616; H10N 70/011; G11C 13/0004; H10B 63/20; H10B 63/80; H10B 63/84; H10B 63/30
See application file for complete search history.

(56) References Cited

U.S. PATENT DOCUMENTS

| | | | |
|---|---|---|---|
| 2010/0203672 A1* | 8/2010 | Eun | H10B 63/20 438/102 |
| 2012/0176831 A1* | 7/2012 | Xiao | H10N 70/8833 257/4 |
| 2013/0175493 A1* | 7/2013 | Song | H10N 70/8413 257/3 |
| 2017/0198393 A1* | 7/2017 | Stassen | H01L 21/0228 |
| 2021/0193585 A1 | 6/2021 | Said et al. | |
| 2021/0193674 A1 | 6/2021 | Said et al. | |
| 2021/0305318 A1* | 9/2021 | Gealy | H10B 63/84 |

OTHER PUBLICATIONS

Xiaoliang Zhang and Jianwen Jiang, "Thermal Conductivity of Zeolitic Imidazolate Framework-8: A Molecular Simulation Study", The Journal of Physical Chemistry C, vol. 117, No. 36, Aug. 2013, pp. 18441-18447.*

* cited by examiner

*Primary Examiner* — Xiaochun L Chen

(57) ABSTRACT

Disclosed semiconductor devices include a substrate, a device pattern structure disposed over the substrate, and a heat insulating layer disposed on the device pattern structure. The device pattern structure includes metal-organic frameworks.

26 Claims, 21 Drawing Sheets

SEMICONDUCTOR DEVICE INCLUDING HEAT INSULATING LAYER AND METHOD OF MANUFACTURING THE SAME

CROSS-REFERENCE TO RELATED APPLICATIONS

The present application claims priority under 35 U.S.C. § 119(a) to Korean Application No. 10-2022-0035022, filed on Mar. 21, 2022 in the Korean Intellectual Property Office, which is incorporated herein by reference in its entirety.

BACKGROUND

1. Technical Field

The present disclosure generally relates to a semiconductor device including a heat insulating layer and a method of manufacturing the same.

2. Related Art

A phase change memory device is a nonvolatile memory device that uses physical properties of a phase change layer, such as a change in crystal state under applied heat, to store signal information. Specifically, in the phase change memory device, the crystal state of the phase change layer may be reversibly changed between an amorphous state and a crystalline state by heat generated in the phase change layer when an external voltage is applied. The crystalline state information of the phase change layer may be used as signal information because the electrical resistances of the phase change layer in the amorphous state and the crystalline state are distinguished from each other.

As described herein, because the operation of changing the crystal state of the phase change layer corresponds to the write operation of the phase change memory device, whether the heat of the phase change layer is effectively controlled may be related to operational reliability of the phase change memory device.

SUMMARY

A semiconductor device according to an embodiment of the present disclosure may include a substrate, a device pattern structure disposed over the substrate, and a heat insulating layer disposed on the device pattern structure, which includes a metal-organic framework.

A semiconductor device according to another embodiment of the present disclosure may include a substrate, and a plurality of unit cells disposed over the substrate to be spaced apart from each other. Each of the plurality of unit cells may include a device pattern structure extending in a direction perpendicular to a surface of the substrate and including a phase change layer, and a heat insulating layer disposed on the device pattern structure. The heat insulating layer may include metal-organic frameworks.

In a method of manufacturing a semiconductor device according to further another embodiment of the present disclosure, a substrate may be provided. A first electrode material layer, a phase change material layer, and a second electrode material layer may be sequentially stacked over the substrate to form a stack structure. The stack structure may be selectively etched to form a device pattern structure including a first electrode layer, a phase change layer, and a second electrode layer over the substrate. A heat insulating layer including a metal-organic framework may be formed on the device pattern structure over the substrate.

BRIEF DESCRIPTION OF THE DRAWINGS

FIGS. 6A to 10A are plan views schematically illustrating a method of manufacturing a semiconductor device according to an embodiment of the present disclosure.

FIGS. 6B to 10B are cross-sectional views taken along line A-A' of the semiconductor device of FIGS. 6A to 10A, respectively.

FIGS. 6C to 10C are cross-sectional views taken along line B-B' of the semiconductor device of FIGS. 6A to 10A, respectively.

DETAILED DESCRIPTION

Figure 1:
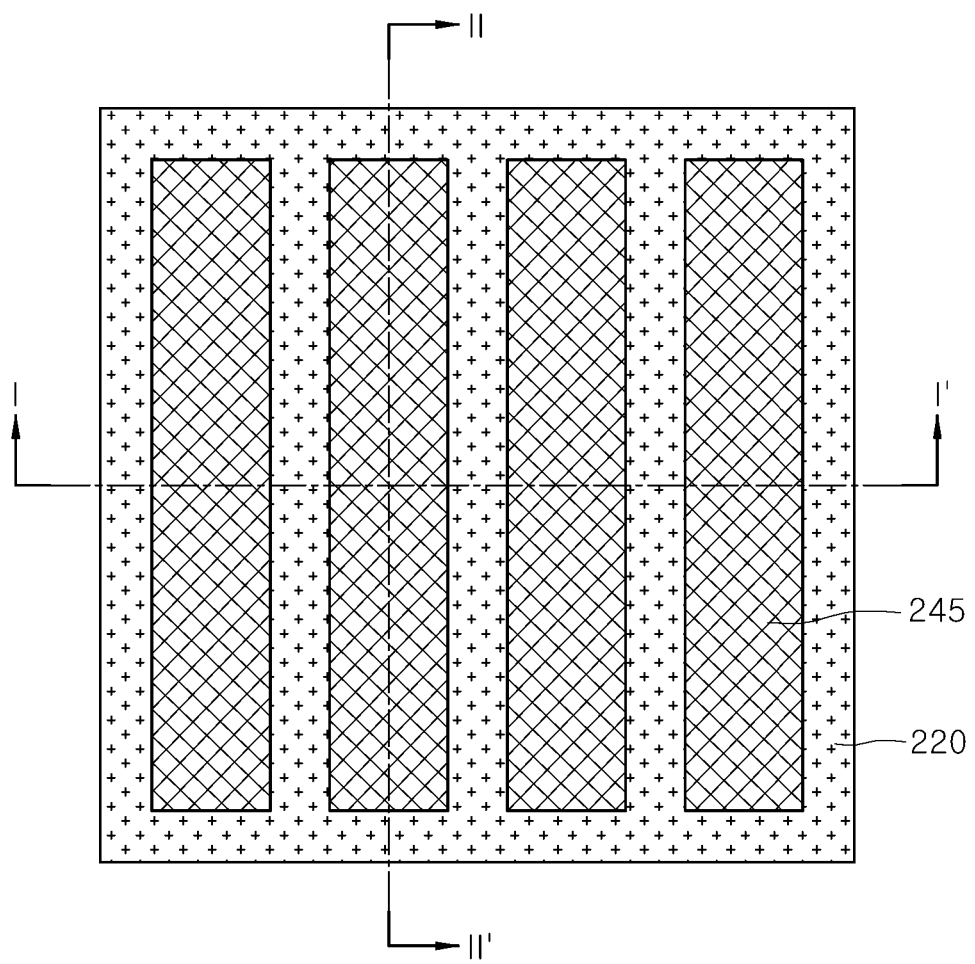
FIG. 1 is a plan view schematically illustrating a semiconductor device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, a device, a part, or combinations thereof, but not used to preclude the presence or possibility of addition one or more other features, numbers, steps, operations, components, devices, parts, or combinations thereof.

Further, in performing a method or a manufacturing method, each process constituting the method can take place differently from the stipulated order unless a specific sequence is described explicitly in the context. Each process may be performed in the same manner as stated order or may be performed substantially at the same time. In another example, at least a part of each of the above processes may be performed in a reversed order.

In this specification, the term "a predetermined direction" may mean a direction encompassing one direction in a coordinate system as well as a direction opposite to that direction. As an example, in the x-y-z coordinate system, the x-direction may encompass a direction parallel to the x-direction. That is, the x-direction may mean all directions in which an absolute value of the z-axis increases in a positive direction along the x-axis from the origin 0 and directions in which an absolute value of the x-axis increases in a negative direction along the x-axis from the origin 0. The y-direction and the z-direction may each be interpreted in substantially the same way in the x-y-z coordinate system.

Figure 2:
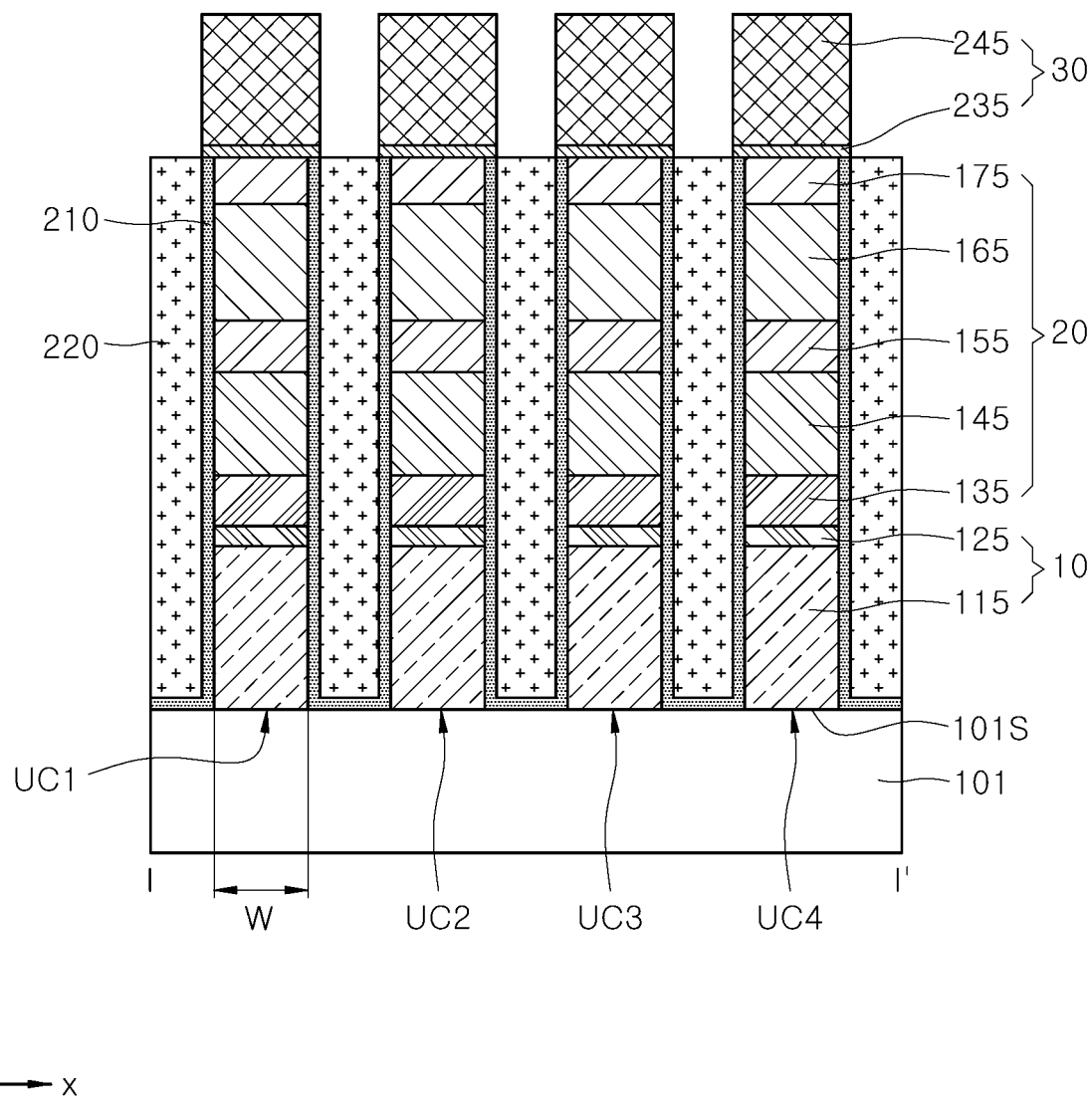
FIG. 2 is a cross-sectional view taken along line I-I' of the semiconductor device of FIG. 1.
Figure 3:
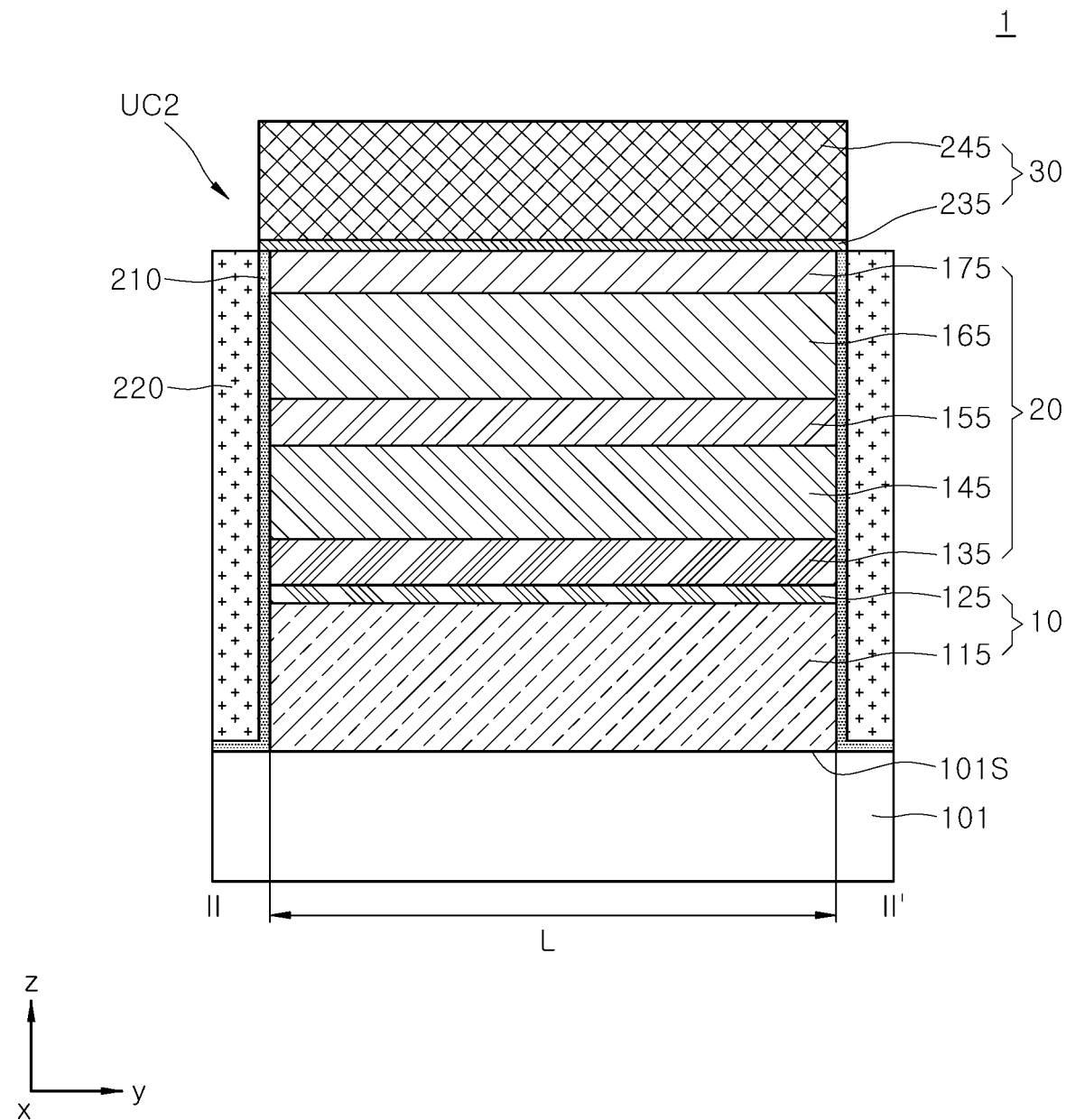
FIG. 3 is a cross-sectional view taken along II-II' of the semiconductor device of FIG. 1.
Figure 4A:
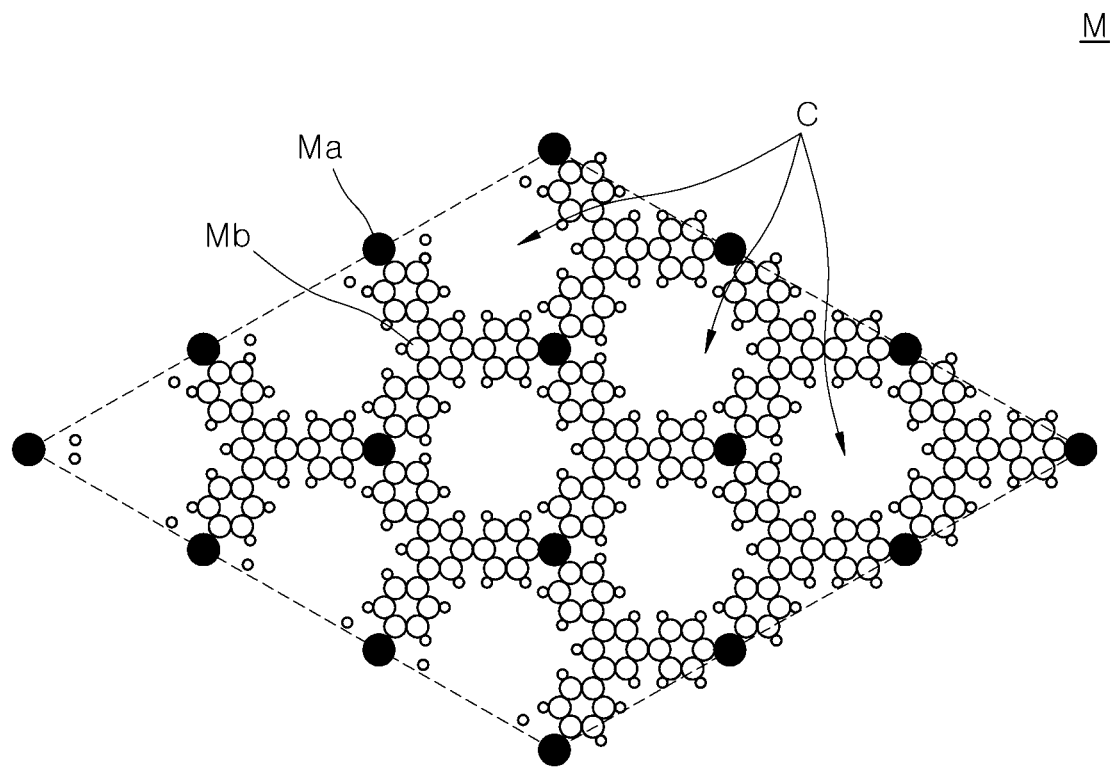
FIG. 4A is a view schematically illustrating a metal-organic framework of a heat insulating layer according to an embodiment of the present disclosure.
Figure 4B:
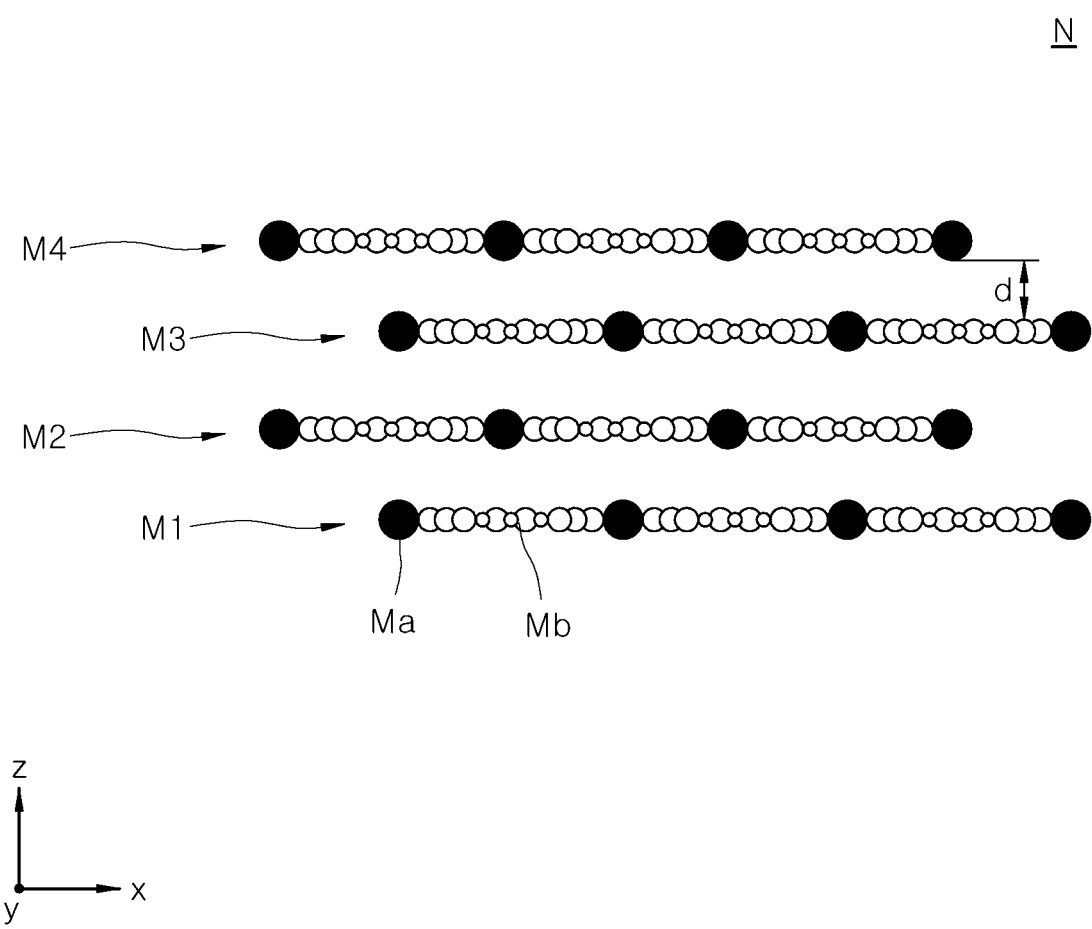
FIG. 4B is a view schematically illustrating a stack shape of metal-organic frameworks of FIG. 4A.

FIG. 1 is a plan view schematically illustrating a semiconductor device according to an embodiment of the present disclosure. FIG. 2 is a cross-sectional view taken along line I-I' of a semiconductor device of FIG. 1. FIG. 3 is a cross-sectional view taken along II-II' of a semiconductor device of FIG. 1. FIG. 4A is a view schematically illustrating a metal-organic framework of a heat insulating layer according to an embodiment of the present disclosure. FIG. 4B is a view schematically illustrating a stack shape of metal-organic frameworks of FIG. 4A.

Referring to FIGS. 1 to 3, a semiconductor device 1 may include a plurality of unit cells UC1, UC2, UC3, and UC4 disposed over a substrate 101. Each of the plurality of unit cells UC1, UC2, UC3, and UC4 may include a device pattern structure 20 disposed over the substrate 101, and a heat insulating layer 210 disposed on a sidewall surface of the device pattern structure 20. The device pattern structure 20 may include a first electrode layer 135, a selecting device layer 145, a second electrode layer 155, a phase change layer 165, and a third electrode layer 175.

In addition, each of the plurality of unit cells UC1, UC2, UC3, and UC4 may include a lower contact structure 10 disposed between the substrate 101 and the device pattern structure 20. Also, each of the plurality of unit cells UC1, UC2, UC3, and UC4 may include an upper contact structure 30 disposed over the device pattern structure 20. In FIGS. 1 to 3, although the first to fourth unit cells UC1, UC2, UC3, and UC4 are illustrated as the plurality of unit cells, the scope and spirit of the present disclosure is not necessarily limited thereto, and other various numbers of unit cells are possible.

The substrate 101 may include a semiconductor material. Specifically, the semiconductor material may include silicon (Si), germanium (Ge), gallium arsenide (GaAs), molybdenum sulfide ($MoS_2$), molybdenum selenide ($MoSe_2$), hafnium selenide ($HfSe_2$), indium selenide (InSe), gallium selenide (GaSe), black phosphorus, indium-gallium-zinc oxide (IGZO), or a combination of two or more thereof. Although not shown, the substrate 101 may include integrated circuits. The integrated circuits may be circuits that drive and control the unit cells UC1, UC2, UC3, and UC4. The integrated circuits may include, for example, devices such as a diode, a transistor, and the like.

Each of the lower contact structures 10 may include a lower contact pattern 115 disposed on the substrate 101, and a lower bonding layer 125 disposed on the lower contact pattern 115. The lower contact pattern 115 may be a structure of a shape of, for example, a square pillar having a predetermined width W in a first direction (e.g., the x-direction), a predetermined length L in a second direction (e.g., the y-direction), and a predetermined thickness in a third direction (e.g., the z-direction).

The lower contact pattern 115 may be electrically connected to the substrate 101. The lower contact pattern 115 may include a conductive material. The conductive material may include, for example, doped silicon (Si), tungsten (W), tungsten silicide, tungsten nitride, titanium nitride, tantalum nitride, or a combination of two or more thereof.

The lower bonding layer 125 may function as an adhesion layer between the lower contact pattern 115 and the device pattern structure 20. Specifically, the lower bonding layer 125 may improve the adhesion between the lower contact pattern 115 and the first electrode layer 135 of the device pattern structure 20. The lower bonding layer 125 may have a predetermined width W in the first direction (e.g., the x-direction), and a predetermined length L in the second direction (e.g., the y-direction). The lower bonding layer 125 may include, for example, metal silicide. When the lower contact pattern 115 includes tungsten (W), the lower bonding layer 125 may include tungsten silicide.

The device pattern structures 20 may be disposed on the lower contact structures 10 and arranged or spaced apart in the x-direction. Each of the device pattern structures 20 may include a pillar structure extending in a direction (i.e., the z-direction) that is substantially perpendicular to a surface 101S of the substrate 101. As an example, each of the device pattern structures 20 may include a square pillar structure.

In an embodiment, each of the device pattern structures 20 may be a resistance change memory device including a phase change layer 165. In addition, each of the device pattern structures 20 may include a selecting device layer 145 electrically connected to the phase change layer 165, which function as a selecting device.

Referring to FIGS. 1 to 3, each of the device pattern structures 20 may include the first electrode layer 135, the selecting device layer 145, the second electrode layer 155, the phase change layer 165, and the third electrode layer 175, which are sequentially stacked on the lower bonding layer 125. The first electrode layer 135, the selecting device layer 145, the second electrode layer 155, the phase change layer 165, and the third electrode layer 175 may be stacked to overlap with each other in a direction (i.e., the z-direction) that is substantially perpendicular to the surface 101S of the substrate 101. That is, each of the first electrode layer 135, the selecting device layer 145, the second electrode layer 155, the phase change layer 165, and the third electrode layer 175 may have the predetermined width W in the first direction (i.e., the x-direction) and the predetermined length L in the second direction (i.e., the y-direction) over planes (e.g., cross-sections parallel to the x-y plane) substantially parallel to the surface 101S of the substrate 101. The first electrode layer 135, the selecting device layer 145, the second electrode layer 155, the phase change layer 165, and the third electrode layer 175 may have substantially the same cross-sectional area.

In addition, the device pattern structures 20 may be disposed to respectively overlap with the lower contact structures 10 in the z-direction. That is, over planes (e.g., cross-sections parallel to the x-y direction) substantially parallel to the surface 101S of the substrate 101, the device pattern structure 20 may have the same cross-sectional area as the lower contact structure 10.

Each of the first to third electrode layers 135, 155, and 175 may include a conductive material. The conductive material may include, for example, doped semiconductor, metal, conductive metal nitride, conductive metal carbide, conductive metal silicide, or conductive metal oxide. The conductive material may include, for example, n-type or p-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. In an embodiment, the first to third electrode layers 135, 155, and 175 may be made of substantially the same material. In another embodiment, at least one of the first to third electrode layers 135, 155, and 175 may be made of a different material from the other two.

The selecting device layer 145 may control electrical access to the phase change layer 165 when an external voltage is applied. As an example, when a magnitude of the voltage applied to opposite ends of the selecting device layer 145 (that is, the voltage applied between the first and second electrode layers 135 and 155) is less than a predetermined threshold, the current flowing through the selecting device layer 145 may be as low as the leakage current. Conversely, when the magnitude of the voltage applied to the opposite ends of the selecting device layer 145 is greater than or equal to the predetermined threshold, the current flowing through the selecting device layer 145 may rapidly increase in substantially the same proportion to the magnitude of the applied voltage. The selecting device layer 145 may include a metal insulator transition (MIT) device layer, a mixed ion-electron conductive (MIEC) device layer, or the like. The MIT device layer may include, for example, niobium oxide ($NbO_2$), titanium oxide ($TiO_2$), or the like. The MIEC device layer may include, for example, $ZrO_2(Y_2O_3)$, $Bi_2O_3$—$BaO$, $(La_2O_3)x(CeO_2)_{1-x}$ ($0<x<1$). As another example, the selecting device layer 145 may include silicon oxide, silicon nitride, or the like.

The phase change layer 165 may function as a resistance change layer of the device pattern structure 20. The crystal state of the phase change layer 165 may be changed depending on an operating voltage applied to the opposite ends of the phase change layer 165 (i.e., the voltage applied between the second and third electrode layers 155 and 175). Heat may be generated in the phase change layer 165 by the operating voltage applied to the opposite ends of the phase change layer 165. The heat may be, for example, Joule heat generated by Joule heating in the phase change layer 165.

When the generated heat is increased over a predetermined threshold value, the heat may cause a reversible change in the crystal state of the phase change layer 165. For example, the crystal state of the phase change layer 165 may change from an amorphous state to a crystalline state. After the applied operating voltage is removed, the phase change layer 165 may maintain the change in the crystal state.

When the phase change layer 165 is in an amorphous state, the electrical resistance of the phase change layer 165 is in a relatively high resistance state, and when the phase change layer 165 is in a crystalline state, the electrical resistance of the phase change layer 165 may be in a relatively low resistance state. Semiconductor devices disclosed herein may store signal information using the electrical resistance states of the phase change layer 165, which are distinguished from each other according to the crystal state of the phase change layer 165.

The phase change layer 165 may include a phase change material. The phase change material may include a chalcogen compound. The chalcogen compound may include, for example, a compound of Ge, Sb, and Te(GST), a compound of Ge, Bi, and Te(GBT), a compound of As, Sb, and Te, a compound of As, Ge, Sb, and Te, a compound of Sn, Sb, and Te, a compound of In, Sn, Sb, and Te, a compound of Ag, In, Sb, and Te, or a combination of two or more thereof. The chalcogen compound may include a dopant. The dopant may include, for example, nitrogen (N), oxygen (O), silicon (Si), or a combination of two or more thereof.

Referring to FIGS. 1 to 3, the heat insulating layer 210 may be disposed on the sidewall surfaces of the lower contact structures 10 and the device pattern structures 20. In an embodiment, when the lower contact structures 10 and the device pattern structures 20 include pillar structures, the heat insulating layer 210 may be disposed to surround outer peripheral surfaces, or outer circumferential surfaces, of the pillar structures. Referring to FIGS. 2 and 3, the heat insulating layer 210 may be partially disposed on the surface 101S of the substrate 101. The heat insulating layer 210 may not be disposed, however, on the surface 101S of the substrate 101 between the lower contact structures 10 and the substrate 101.

The heat insulating layer 210 may perform a function of suppressing propagation of heat generated inside a phase change layers 165 of a device pattern structure 20 beyond the unit cell. As described above, heat may be generated in the phase change layer 165 due to application of an operating voltage to opposite ends of a phase change layer 165. Without any insulating measures, some of the heat may propagate out of the phase change layer 165 without being consumed in the phase change process of the phase change layer 165. As the amount of excess heat increases, the efficiency of the write operation under the operating voltage may decrease.

The heat insulating layer 210 may reduce excess heat propagating to the outside of the device pattern structures 20, thereby preventing decreases in the efficiency of write operations. That is, the heat insulating layer 210 may help to preserve or retain the heat, generated by the operating voltage, within the device pattern structures 20. In addition, the heat insulating layer 210 may prevent the heat generated in any one of the plurality of unit cells UC1, UC2, UC3, and UC4 from propagating to other neighboring unit cells. Compared to embodiments of the present disclosure, in the absence of a heat insulating layer 210, the heat generated in one unit cell may propagate to the neighboring unit cells and inadvertently change the crystal state of the phase change layer in neighboring unit cells. Accordingly, write errors may occur in the neighboring unit cells.

The heat insulating layer 210 may include a metal-organic framework. The metal-organic framework may have a heat insulating property. Referring to FIG. 4A, the metal-organic framework M may be a material formed with coordinate bonding between metal-containing nodes Ma and organic ligands Mb. The metal-organic framework M may have a porous structure including cavities C. In an embodiment, the cavities C may include gases found in air. In another embodiment, the cavities C may include other gases besides the gases found in the air. For example, the cavities C may include any gas provided for semiconductor processes and any gas formed from the semiconductor processes. Therefore, the metal-organic framework M including cavities C may exhibit low thermal conductivity. As an example, a metal-organic framework M may have a thermal conductivity of less than 0.1 W/mK.

The metal-containing node Ma may include, for example, a metal ion or a metal cluster. The metal may include, for example, zinc (Zn), chromium (Cr), indium (In), gallium (Ga), copper (Cu), iron (Fe), molybdenum (Mo), cobalt (Co), ruthenium (Ru), manganese (Mn), lanthanum (La), titanium (Ti), hafnium (Hf), cadmium (Cd), zirconium (Zr), and the like. The organic ligand Mb may include, for example, oxalic acid, fumaric acid, benzenehexathiol, triphenylenehexathiol, 1,4-benzene dicarboxylic acid, hexaaminobenzene, tetrakis(4-carboxyphenyl)-porphyrinato-cobalt (II), tetrakis(4-carboxyphenyl)-porphyrin, and the like. The organic ligand Mb may include, as another example, $H_2BDC$, $H_2BDC$-Br, $H_2BDC$-OH, $H_2BDC$-NO2, $H_2BDC$-$NH_2$, $H_4DOT$, $H_2BDC$-$(Me)_2$, $H_2BDC$-$(Cl)_2$, and the like.

In an embodiment, the metal-organic framework M may have a physically and chemically stable two-dimensional mesh bonding structure. As shown in FIG. 4A, in the metal-organic framework M, coordination bonds between the metal-containing nodes Ma and the organic ligands Mb may be regularly formed in two dimensions. As a result, the metal-organic framework M may exist in the form of a sheet having a nanoscale thickness (for example, 1 nm to 100 nm).

Referring to FIG. 4B, the heat insulating layer 210 may include a stack N of a plurality of metal-organic frameworks M1, M2, M3, and M4. Each of the plurality of metal-organic frameworks M1, M2, M3, and M4 may be substantially the same as the two-dimensional metal-organic framework M described with reference to FIG. 4A. The plurality of metal-organic frameworks M1, M2, M3, and M4 may be coupled to each other at predetermined intervals d by van der Waals force. The plurality of metal-organic frameworks M1, M2, M3, and M4 may be coupled to each other in a direction perpendicular to a surface of the sheet having a two-dimensional structure. In addition, each of the plurality of metal-organic frameworks M1, M2, M3, and M4 have a stable two-dimensional mesh bonding structure, so the stack N of the plurality of metal-organic frameworks M1, M2, M3, and M4 may be structurally stable.

In some embodiments not shown in FIGS. 4A and 4B, the metal-organic framework may have a three-dimensional structure. In a three-dimensional structure, metal-containing nodes and organic ligands, which make up the metal-organic framework, may be respectively disposed at fixed positions within a three-dimensional unit lattice. The metal-organic framework having a three-dimensional structure may include, for example, zeolitic imidazolate frameworks named such as ZIF-N (where N is 1 to 12). The metal-organic framework having a three-dimensional structure may be a porous structure that includes cavities resulting in thermal insulating characteristics.

Referring to FIGS. 1 to 3 again, an insulating layer 220 in contact with the heat insulating layer 210 may be disposed over the substrate 101. Portions of the heat insulating layer 210 may be disposed between the insulating layer 220 and the substrate 101. The insulating layer 220 may insulate the plurality of unit cells UC1, UC2, UC3, and UC4 from each other. The insulating layer 220 may include an insulating material. The insulating material may include, for example, oxide, nitride, oxynitride, or a combination of two or more thereof.

The upper contact structures 30 may be disposed on the device pattern structures 20. Each of the upper contact structures 30 may include an upper bonding layer 235 disposed on the third electrode layer 175 of the device pattern structure 20, and an upper contact pattern 245 disposed on the upper bonding layer 235.

The upper bonding layer 235 may function as an adhesion layer between the device pattern structure 20 and the upper contact pattern 245. Specifically, the upper bonding layer 235 may improve adhesion between the device pattern structure 20 and the upper contact pattern 245. The upper bonding layer 235 may include, for example, metal silicide. When the upper contact pattern 245 includes tungsten (W), the upper bonding layer 235 may include tungsten silicide.

The upper contact pattern 245 may include a conductive material. The conductive material may include, for example, doped silicon, tungsten (W), tungsten silicide, tungsten nitride, titanium nitride, tantalum nitride, or a combination of two or more thereof.

The upper contact pattern 245 may be electrically connected to a predetermined upper conductive line (not shown). The upper conductive line may provide a voltage for driving the device pattern structure 20 through the upper contact pattern 245. The upper conductive line may be formed as a plurality of conductive lines to respectively correspond to the plurality unit cells UC1, UC2, UC3, and UC4. Alternatively, the upper conductive line may be disposed in a single conductive line that is shared by a corresponding plurality unit cells (such as UC1, UC2, UC3, and UC4) in common. However, the present disclosure is not necessarily limited thereto, and the configuration and arrangement of the upper conductive line may be variously modified according to the design form and requirements of the semiconductor devices.

In some embodiments, the lower bonding layer 125 of the lower contact structure 10 and the upper bonding layer 235 of the upper contact structure 30 may be omitted. In such embodiments, the lower contact pattern 115 and the first electrode layer 135 may have a sufficient adhesive force at an interface. Similarly, the third electrode layer 175 and the upper contact pattern 245 may have sufficient adhesive force at an interface.

In some embodiments, the first electrode layer 135 and the selecting device layer 145 of the device pattern structure 20 may be omitted. Accordingly, the second electrode layer 155 and the lower bonding layer 125 may be in contact with each other.

In some embodiments, each of the second electrode layer 155 and the third electrode layer 175 disposed at opposite ends of the phase change layer 165 may include two or more conductive layers in order to effectively generate and maintain the heat required for a phase change in the phase change layer 165.

In some embodiments, a lower conductive line (not shown) may be disposed between the substrate 101 and the lower contact pattern 115, and instead of the lower contact pattern 115 in contact with the substrate 101, the lower contact pattern 115 may be in contact with the lower conductive line. The lower conductive line may provide a voltage for driving the device pattern structure 20 to the lower contact pattern 115.

The lower conductive line may be configured in a plurality of conductive lines to respectively correspond to the plurality of unit cells UC1, UC2, UC3, and UC4. Alternatively, the lower conductive line may be arranged in a single conductive line to correspond in common to the plurality of unit cells UC1, UC2, UC3, and UC4. However, the present disclosure is not necessarily limited thereto, and the configuration and arrangement of the lower conductive line may be variously modified according to the design form and requirements of the semiconductor devices.

In some embodiments, the positions of the selecting device layer 145 and the phase change layer 165 may be exchanged. That is, the phase change layer 165 may be disposed between the first electrode layer 135 and the second electrode layer 155, and the selecting device layer 145 may be disposed between the second electrode layer 155 and the third electrode layer 175.

As described above, semiconductor devices according to embodiments of the disclosure may include a substrate, a device pattern structure disposed over the substrate, and a heat insulating layer disposed on or around the device pattern structure. The heat insulating layer may include a metal-organic framework having thermal insulating properties.

The heat insulating layer may conserve the heat generated by an operating voltage inside the device pattern structure. Accordingly, the thermal efficiency of a write operation on the device pattern structure is increased, and thus the efficiency of the write operation may be improved. In addition, because the heat insulating layer blocks the heat generated in one unit cell of the semiconductor device from propagating to another neighboring unit cell, the operational reliability of the semiconductor device may be improved.

Figure 5:
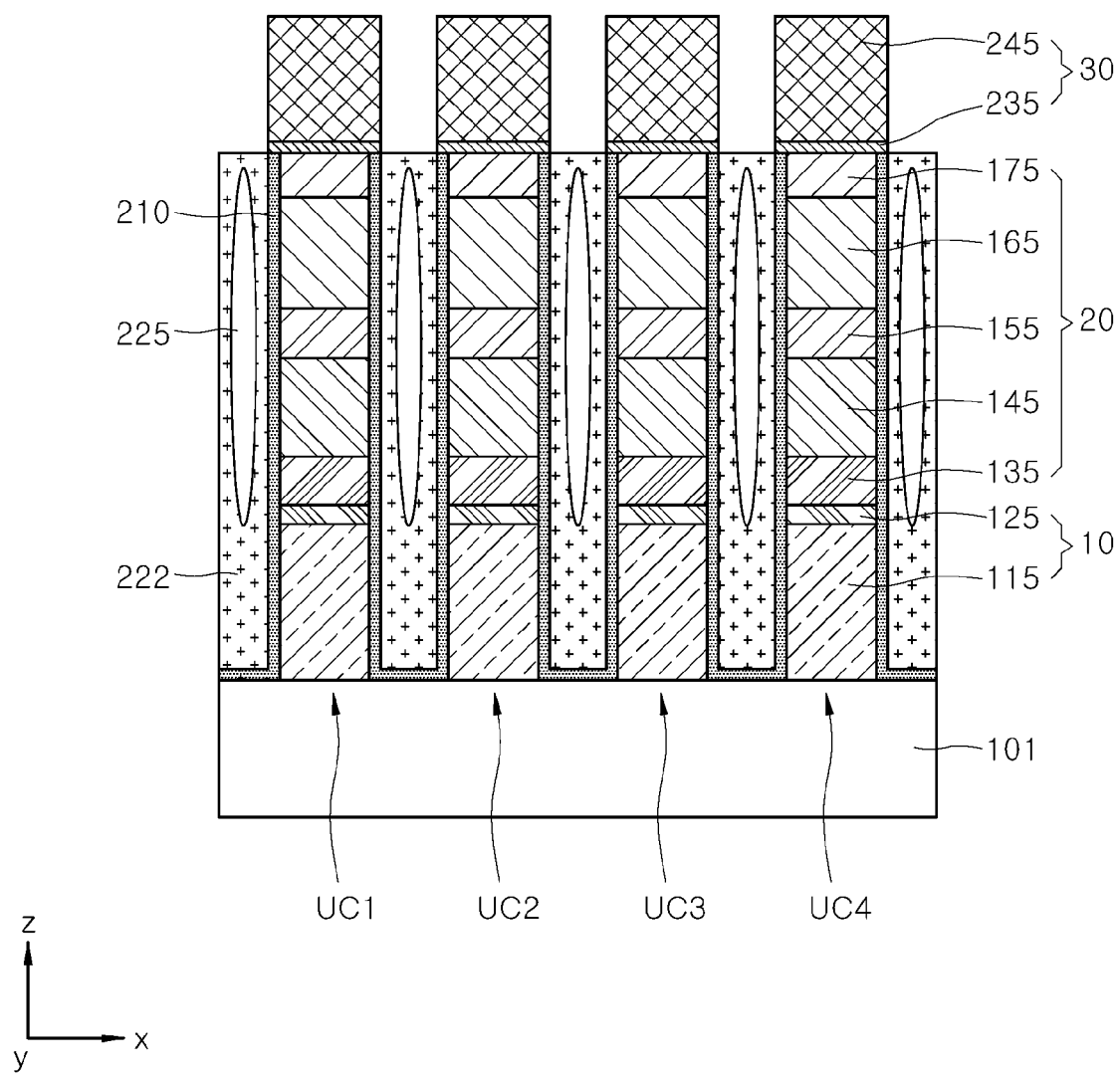
FIG. 5 is a cross-sectional view schematically illustrating a semiconductor device according to another embodiment of the present disclosure.

FIG. 5 is a cross-sectional view schematically illustrating a semiconductor device according to another embodiment of the present disclosure. A semiconductor device 2 may have a different configuration from a semiconductor device 1 in that unlike insulating layer 220 illustrated in FIGS. 1-3, 4A, and 4B, in FIG. 5, an insulating layer 222 includes air gaps 225. The configuration of the semiconductor device 2, except for the insulating layer 222, may be substantially the same as that of the semiconductor device 1.

In an embodiment, the air gaps 225 may include gases found in air. In another embodiment, the air gaps 225 may include other gases besides the gases found in the air. For example, the air gaps 225 may include any gas provided for semiconductor processes and any gas formed from the semiconductor processes. The air gaps 225 including the gases may reduce the conductivity of heat passing through the insulating layer 222. That is, the insulating characteristics of the insulating layer 222 may be improved by including the air gaps 225. Accordingly, the air gaps 225 may improve a property in which a plurality of unit cells UC1, UC2, UC3, and UC4 are thermally separated from each other. In an embodiment, the air gaps 225 inside the insulating layer 222 may include various gases found in the atmosphere. In another embodiment, the air gaps 225 inside the insulating layer 222 may include at least one of a gas provided for a semiconductor process and a byproduct gas generated from the semiconductor process.

The insulating layer 222 may include, for example, oxide, nitride, oxynitride, or a combination of two or more thereof. As will be described later, the air gaps 225 may be formed in the insulating layer 222 by controlling process conditions when the insulating layer 222 is formed.

FIGS. 6A to 10A are plan views schematically illustrating a method of manufacturing a semiconductor device according to an embodiment of the present disclosure. FIGS. 6B to 10B are cross-sectional views taken along line A-A' of the semiconductor device of FIGS. 6A to 10A, respectively. FIGS. 6C to 10C are cross-sectional views taken along line B-B' of the semiconductor device of FIGS. 6A to 10A, respectively.

Figure 6A:
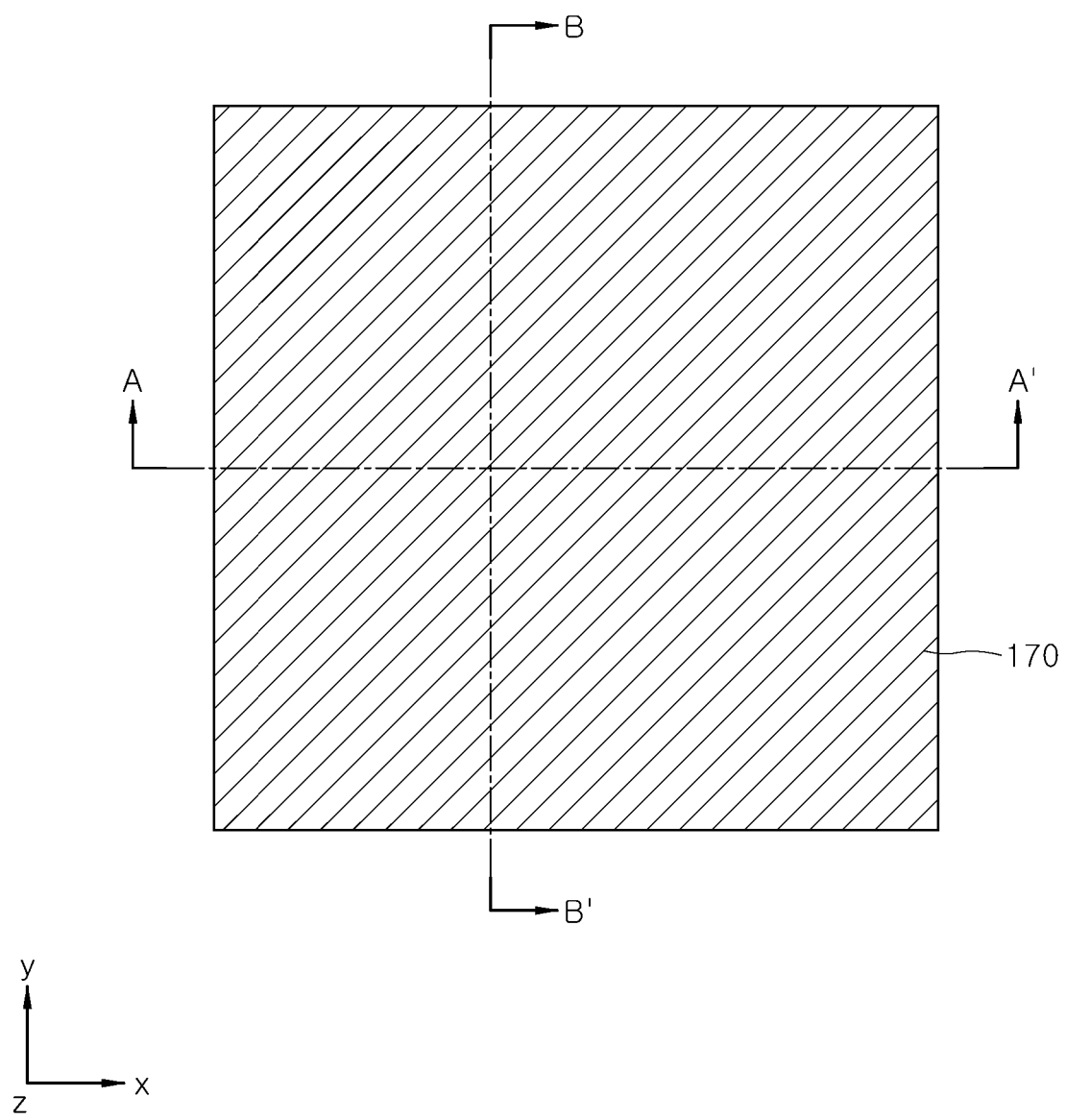
Figure 6B:
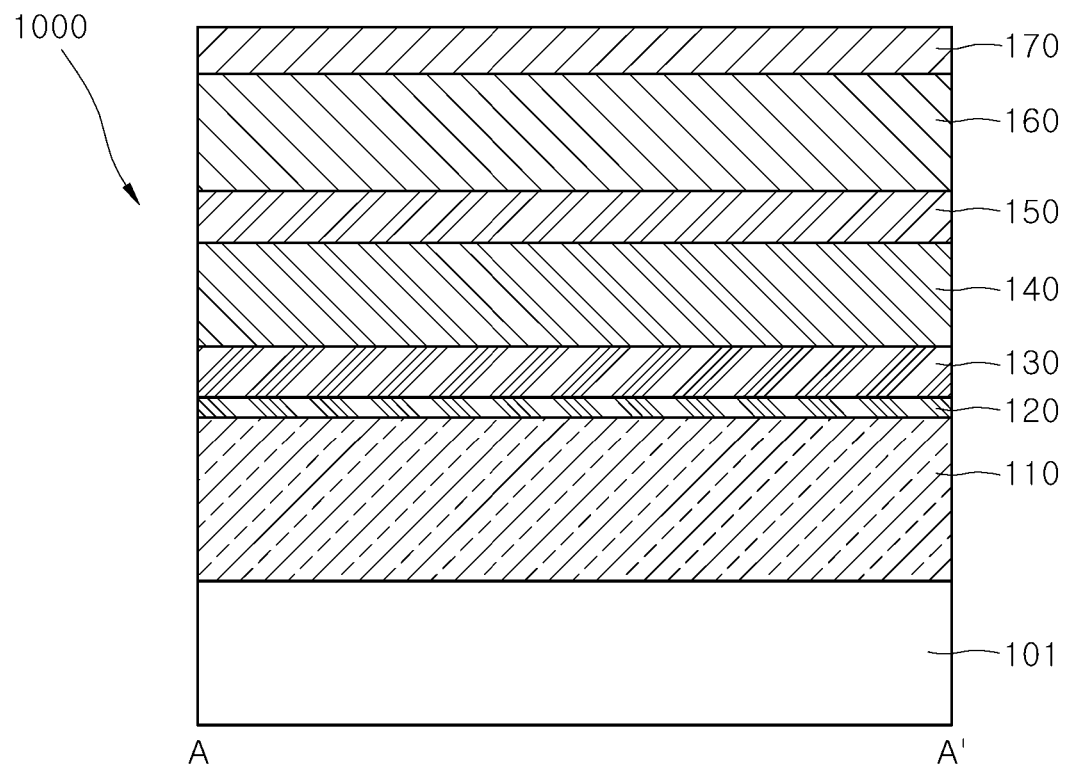
Figure 6C:
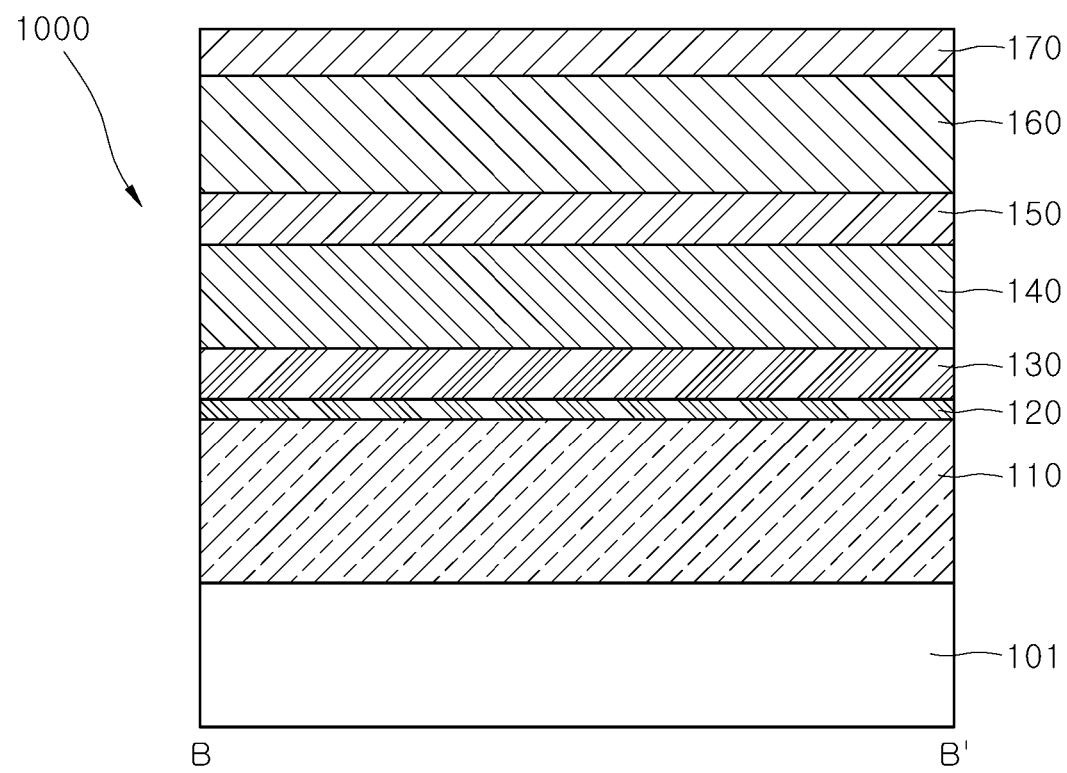

Referring to FIGS. 6A, 6B, and 6C, a substrate 101 may be provided. The substrate 101 may include a semiconductor material. Specifically, the semiconductor material may include silicon (Si), germanium (Ge), gallium arsenide (GaAs), molybdenum sulfide ($MoS_2$), molybdenum selenide ($MoSe_2$), hafnium selenide ($HfSe_2$), indium selenide (InSe), gallium selenide (GaSe), black phosphorus, indium-gallium-zinc oxide (IGZO), or a combination or two or more thereof. Although not shown, the substrate 101 may include integrated circuits. The integrated circuits may be circuits that drive and control unit cells UC1, UC2, UC3, and UC4. The integrated circuits may include devices such as diodes and transistors.

A lower contact material layer 110, a lower bonding material layer 120, a first electrode material layer 130, a selecting device material layer 140, a second electrode material layer 150, a phase change material layer 160, and a third electrode material layer 170 may be sequentially stacked on the substrate 101 to form a stack structure 1000. Each of the lower contact material layer 110, the lower bonding material layer 120, the first electrode material layer 130, the selecting device material layer 140, the second electrode material layer 150, the phase change material layer 160, and the third electrode material layer 170 may be formed by, for example, a sputtering method, a chemical vapor deposition method, or an atomic layer deposition method.

Each of the lower contact material layer 110, the first electrode material layer 130, the second electrode material layer 150, and the third electrode material layer 170 may include a conductive material. The conductive material may include, for example, doped silicon, tungsten (W), tungsten silicide, tungsten nitride, titanium nitride, tantalum nitride, or a combination of two or more thereof.

In some embodiments, each of the second electrode material layer 150 and the third electrode material layer 170, which are disposed at opposite ends of the phase change material layer 160, may be formed to include two or more conductive layers.

The lower bonding material layer 120 may include metal silicide. As an example, when the lower contact material layer 110 includes tungsten (W), the lower bonding material layer 120 may include tungsten silicide.

The selecting device material layer 140 may include, for example, metal oxide, such as niobium oxide ($NbO_2$), or titanium oxide ($TiO_2$). The selecting device material layer 140 may include, as another example, metal oxide, such as $ZrO_2(Y_2O_3)$, $Bi_2O_3$—BaO, or $(La_2O_3)x(CeO_2)_{1-x}$ (0<x<1). The selecting device material layer 140 may include, as another example, silicon oxide, silicon nitride, or the like.

The phase change material layer 160 may include a chalcogen compound. The chalcogen compound may include, for example, a compound of Ge, Sb, and Te(GST), a compound of Ge, Bi, and Te(GBT), a compound of As, Sb, and Te, a compound of As, Ge, Sb, and Te, a compound of Sn, Sb, and Te, a compound of In, Sn, Sb, and Te, a compound of Ag, In, Sb, and Te, or a combination of two or more thereof. The chalcogen compound may include a dopant. The dopant may include, for example, nitrogen (N), oxygen (O), silicon (Si), or a combination of two or more thereof.

Figure 7A:
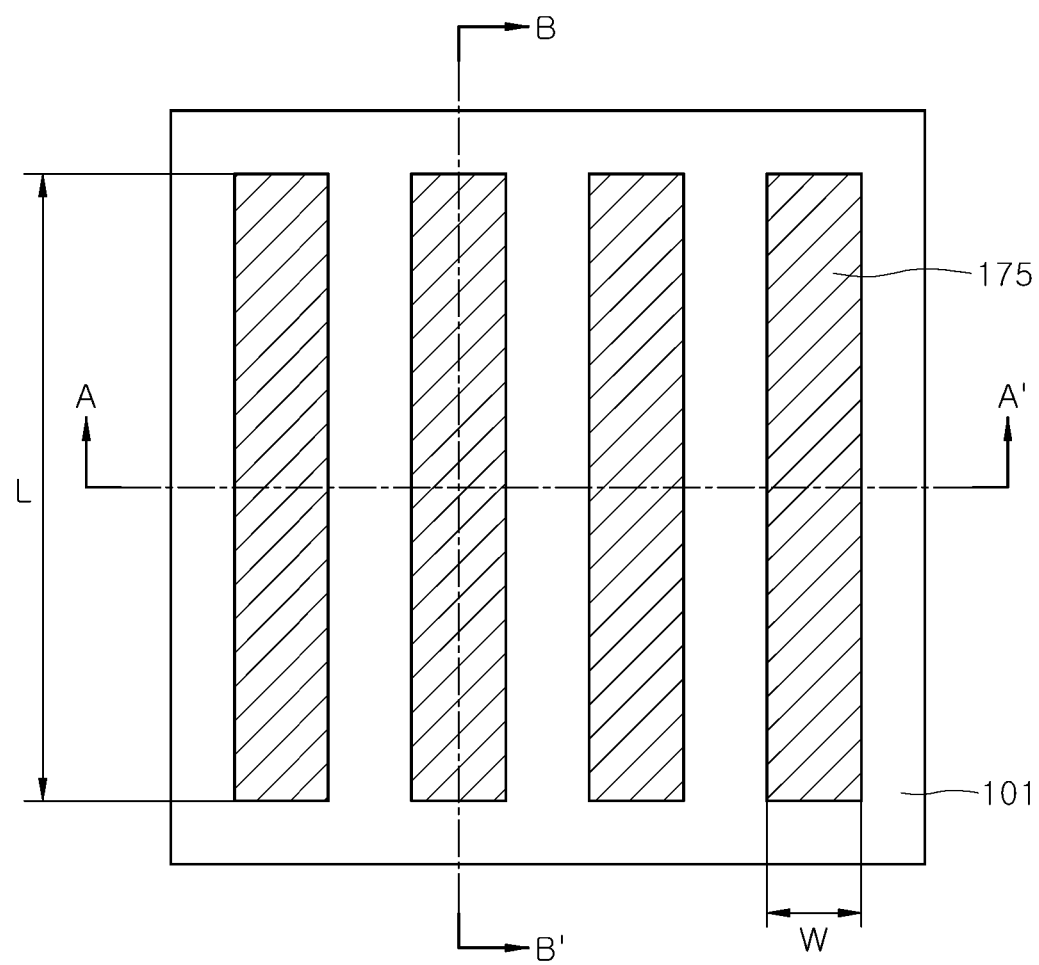
Figure 7B:
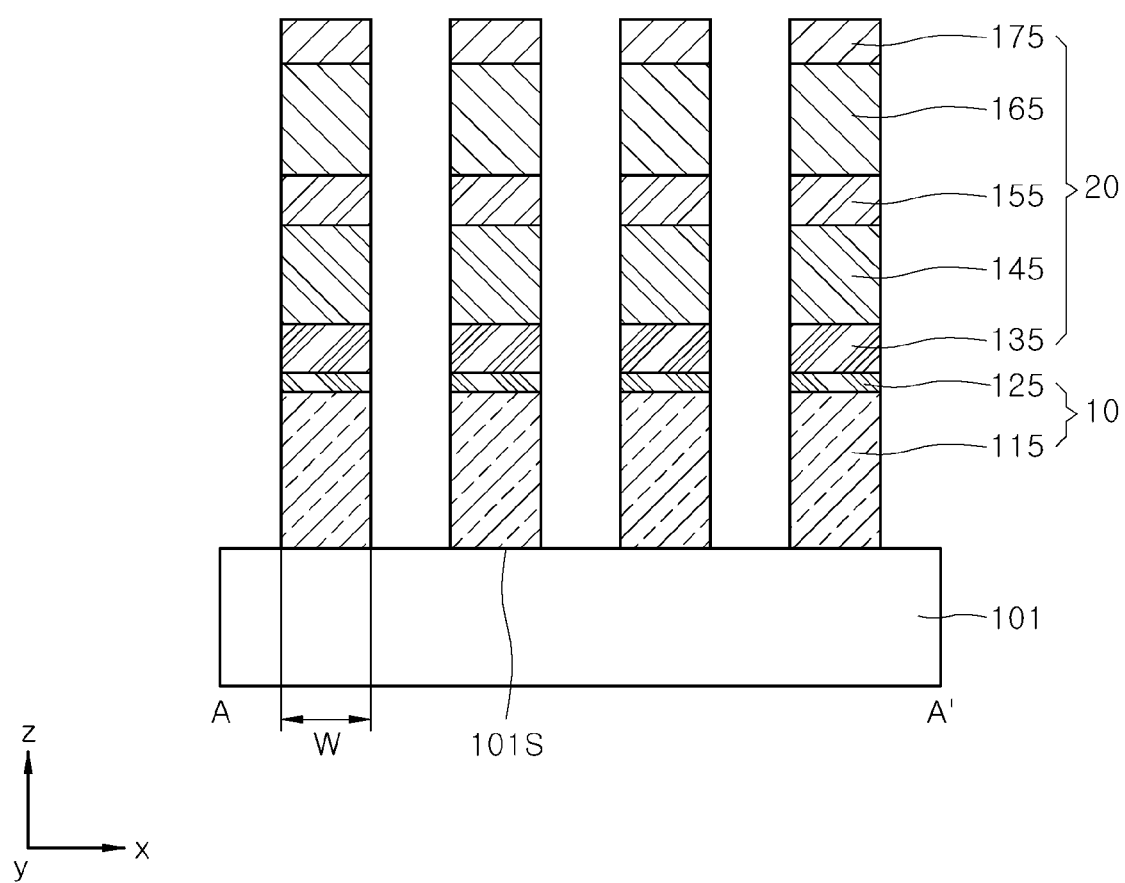
Figure 7C:
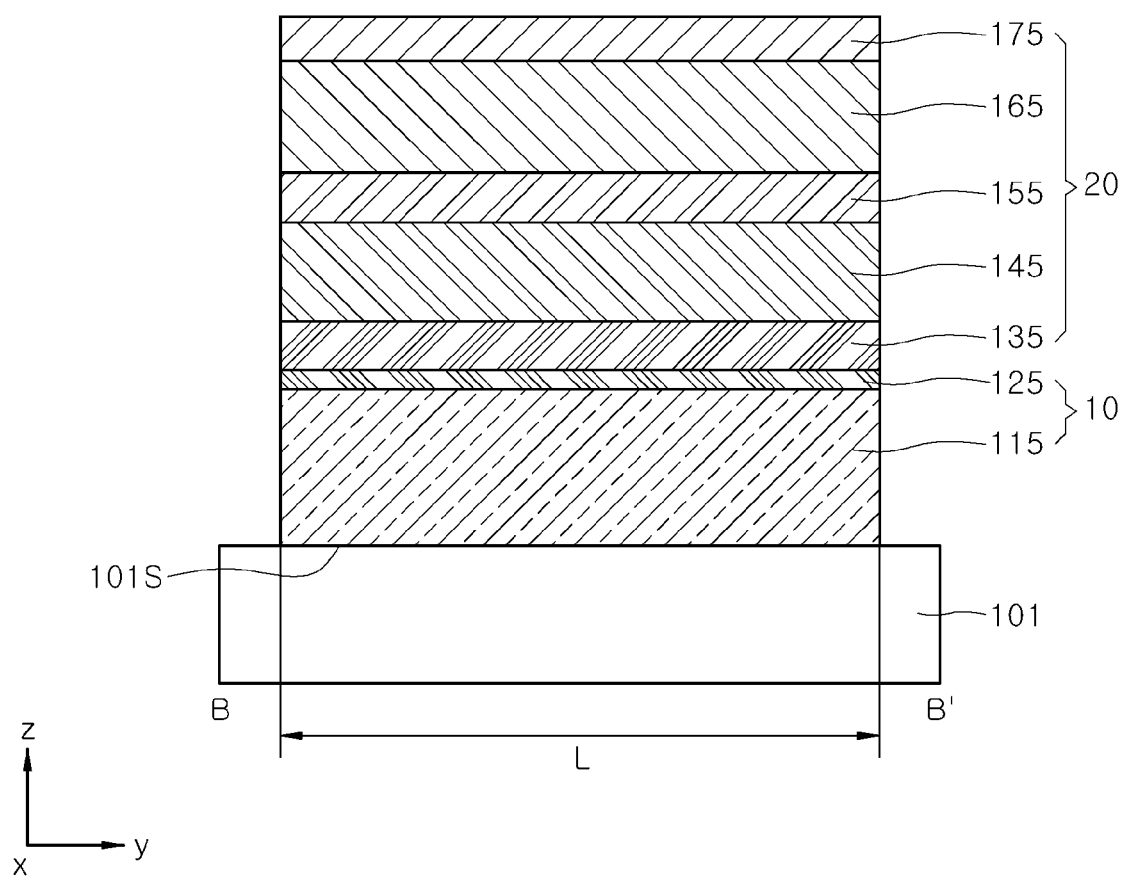

Referring to FIGS. 7A, 7B, and 7C, the stack structure 1000 of FIGS. 6A, 6B, and 6C may be selectively etched to expose portions of a surface 101S of the substrate 101 and to form lower contact structures 10 and device pattern structures 20 over the substrate 101.

Each of the lower contact structures 10 may include a lower contact pattern 115 disposed on the substrate 101, and a lower bonding layer 125 disposed on the lower contact pattern 115. Each of the device pattern structures 20 may include a first electrode layer 135 disposed on the lower bonding layer 125, a selecting device layer 145 disposed on the first electrode layer 135, a second electrode layer 155 disposed on the selecting device layer 145, a phase change layer 165 disposed on the second electrode layer 155, and a third electrode layer 175 disposed on the phase change layer 165.

The lower contact structures 10 and the device pattern structures 20 may be formed to respectively overlap with each other in a direction (e.g., the z-direction) substantially perpendicular to the surface 101S of the substrate 101. Accordingly, each of the lower contact structures 10 and each of the device pattern structures 20 may have a predetermined width W in a first direction (i.e., the x-direction) and a predetermined length L in a second direction (i.e., the y-direction) in cross-sections (e.g., planes parallel to the x-y direction) that are parallel to the surface 101S of the substrate 101.

Figure 8A:
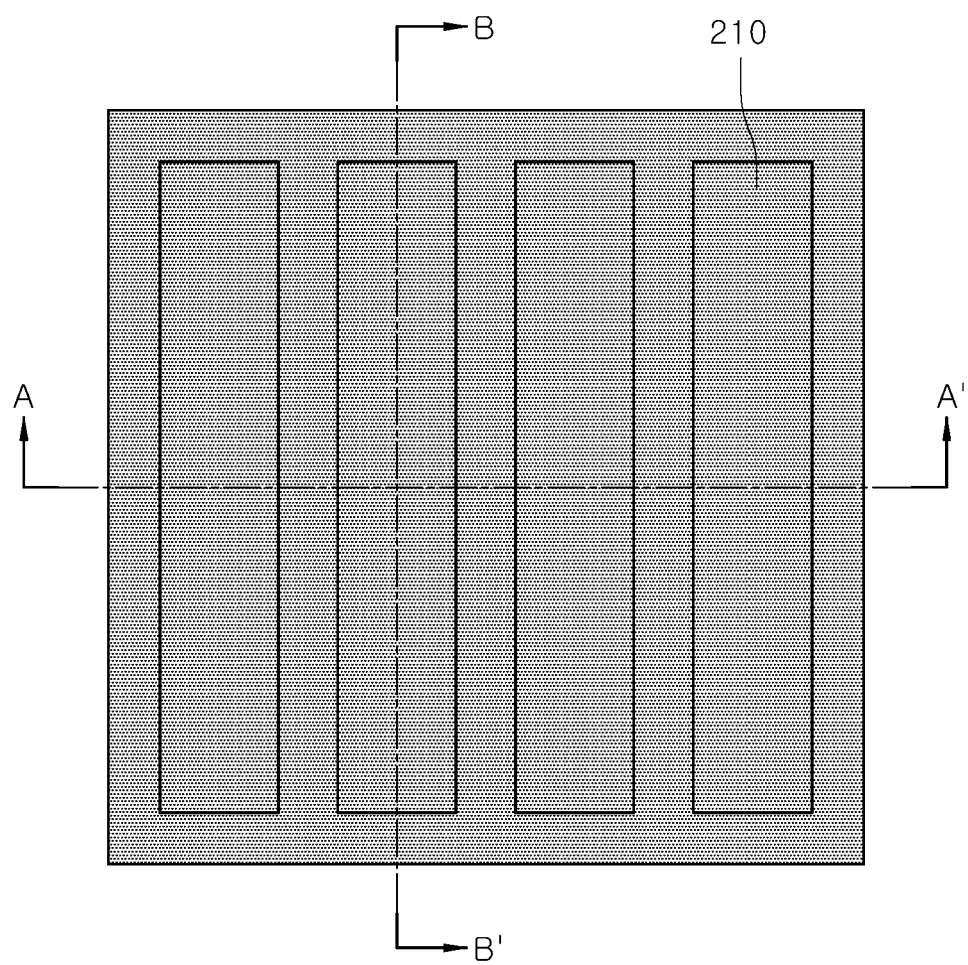
Figure 8B:
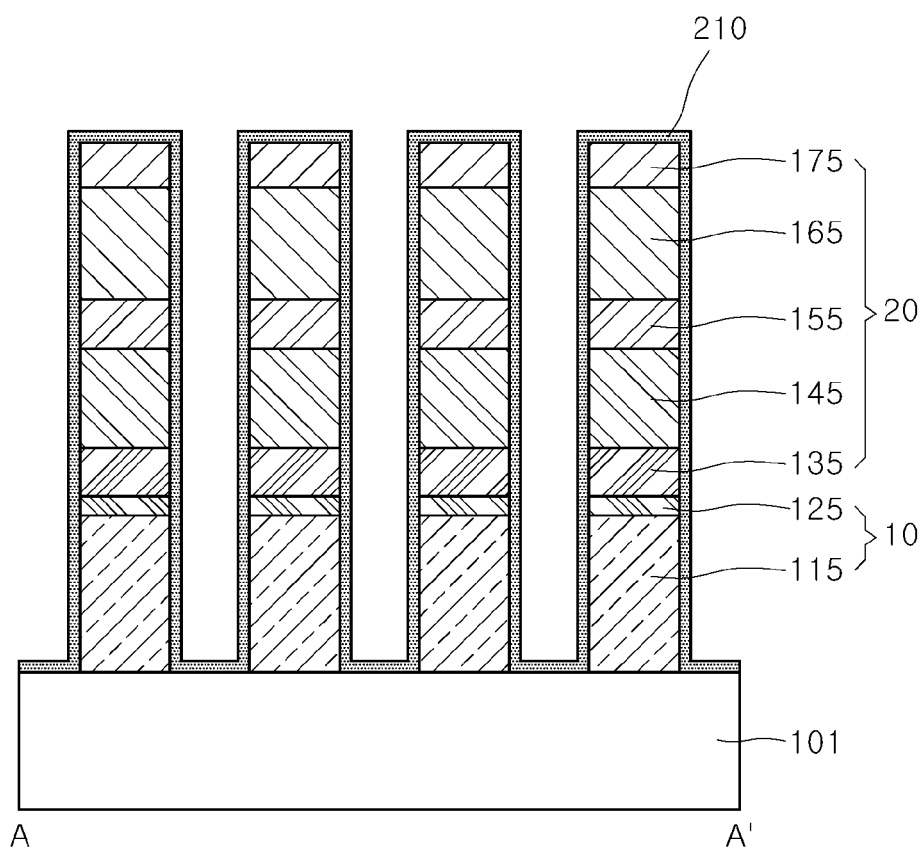
Figure 8C:
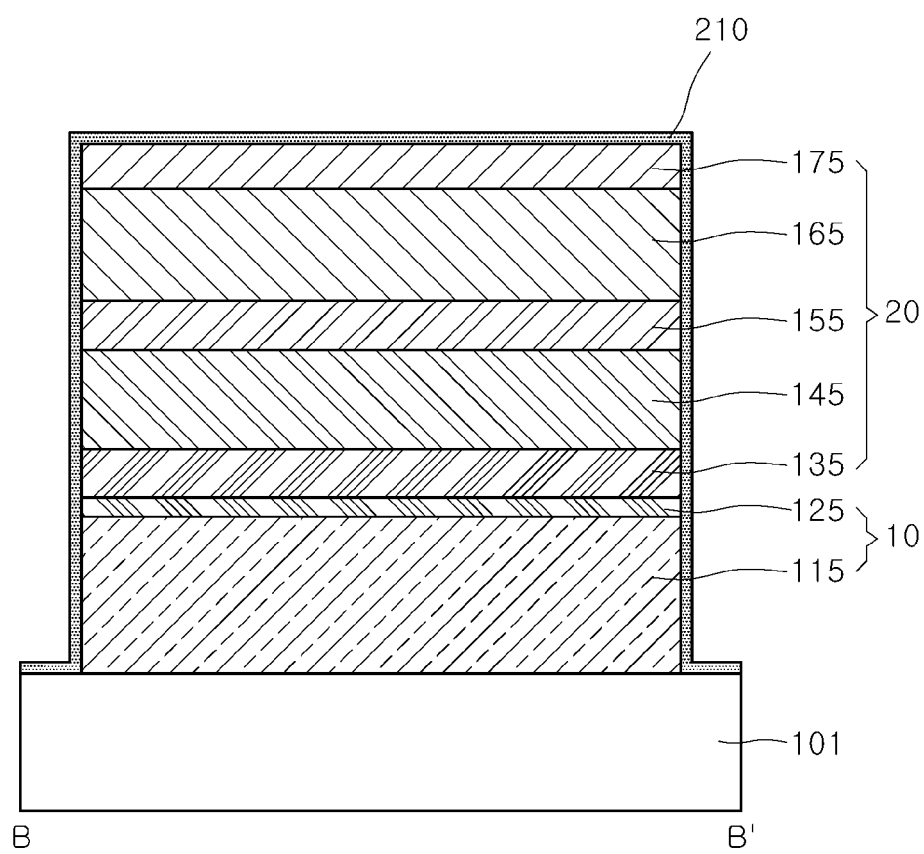

Referring to FIGS. 8A, 8B, and 8C, a heat insulating layer 210 may be formed on the lower contact structures 10 and the device pattern structures 20, which are arranged over the substrate 101. The heat insulating layer 210 may be formed to cover portions of the upper surface of the substrate 101 (surface 101S of FIGS. 7B and 7C), sidewall surfaces of the lower contact structures 10, and sidewall surfaces and upper surfaces of the device pattern structures 20.

The heat insulating layer 210 may include a metal-organic framework. The metal-organic framework may have a heat insulating property. As described above with reference to FIG. 4A, the metal-organic framework M may be a material formed with coordinate bonding between metal-containing nodes Ma and organic ligands Mb. The metal-organic framework M may have a porous structure having cavities C. The metal-organic framework M may have low thermal conductivity, such as for example, thermal conductivity of less than 0.1 W/mK.

In an embodiment, the heat insulating layer 210 may be formed by forming the metal-organic framework M utilizing an atomic deposition method or a chemical vapor deposition method that uses a first precursor containing metal constituting the metal node and a second precursor containing an organic ligand. In the atomic layer deposition method, as shown for example in FIG. 4B, metal-organic frameworks M1, M2, M3, and M4 each having a two-dimensional structure including cavities may be formed layer by layer.

In another embodiment, the process of forming the heat insulating layer 210 may include a process of synthesizing the metal-organic frameworks using the first precursor containing the metal constituting the metal node and the second precursor containing the organic ligand, and a process of coating the synthesized metal-organic frameworks on the lower contact structures 10 and the device pattern structures 20.

Figure 9A:
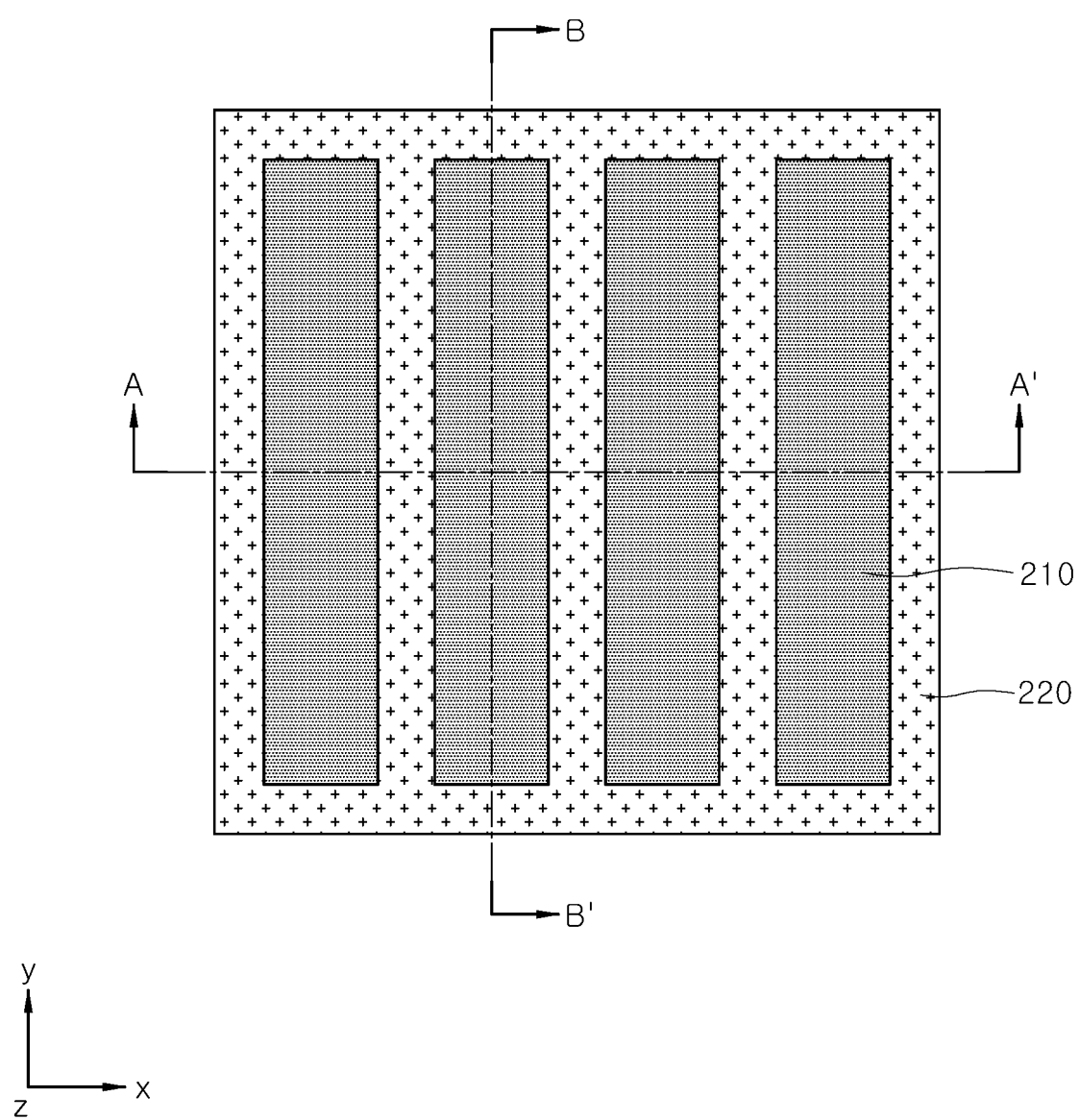
Figure 9B:
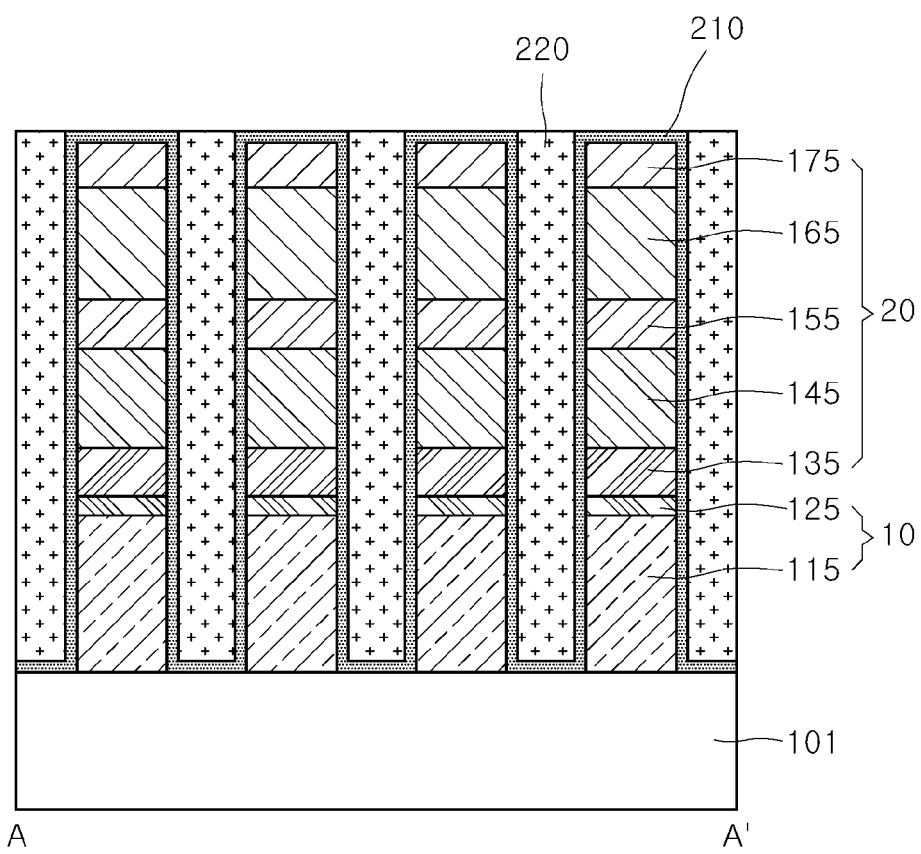
Figure 9C:
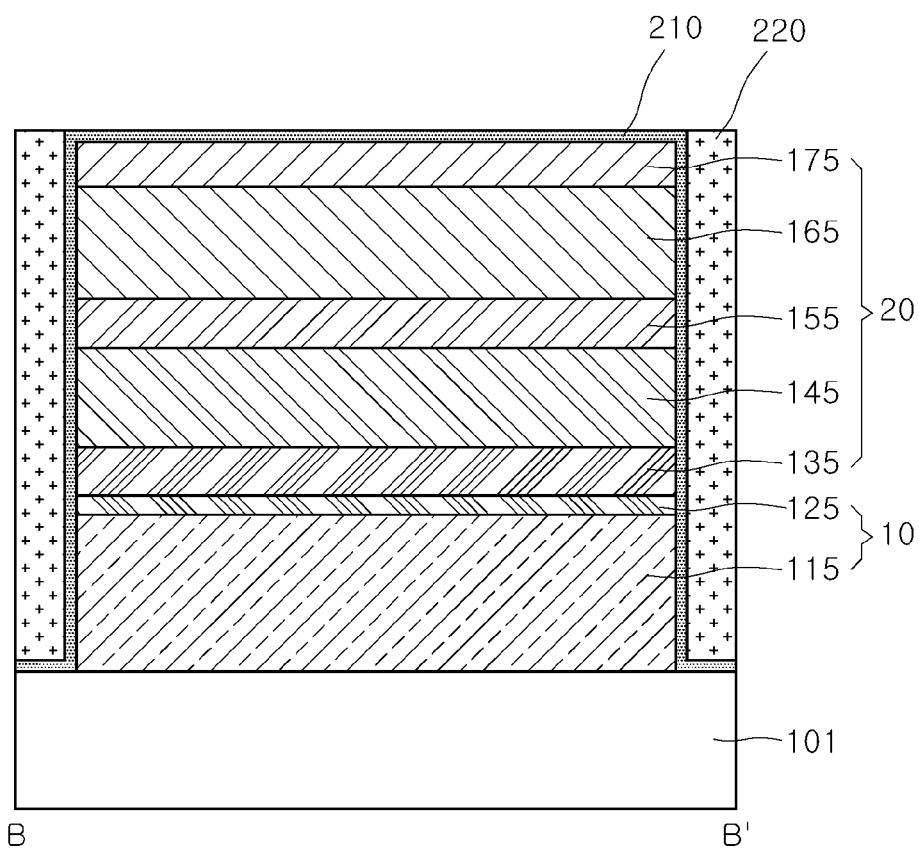
Figure 9C:
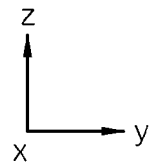

Referring to FIGS. 9A, 9B, and 9C, an insulating layer 220 in contact with the heat insulating layer 210 may be formed over the substrate 101. The insulating layer 220 may be formed to fill spaces between the adjacent lower contact structures 10 and spaces between the adjacent device pattern structures 20. The insulating layer 220 may be formed by, for example, a chemical vapor deposition method or an atomic layer deposition method.

Figure 10A:
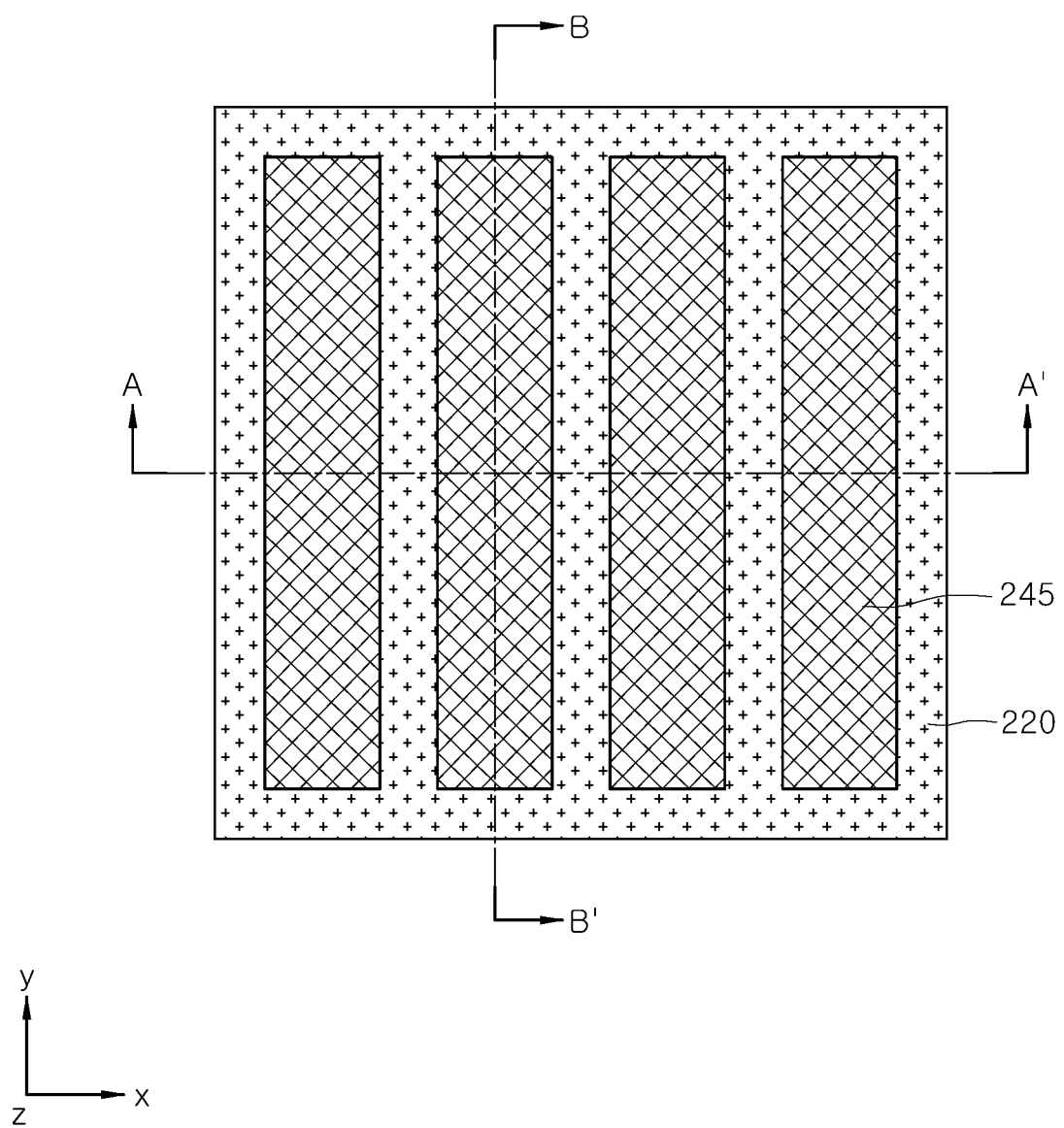
Figure 10B:
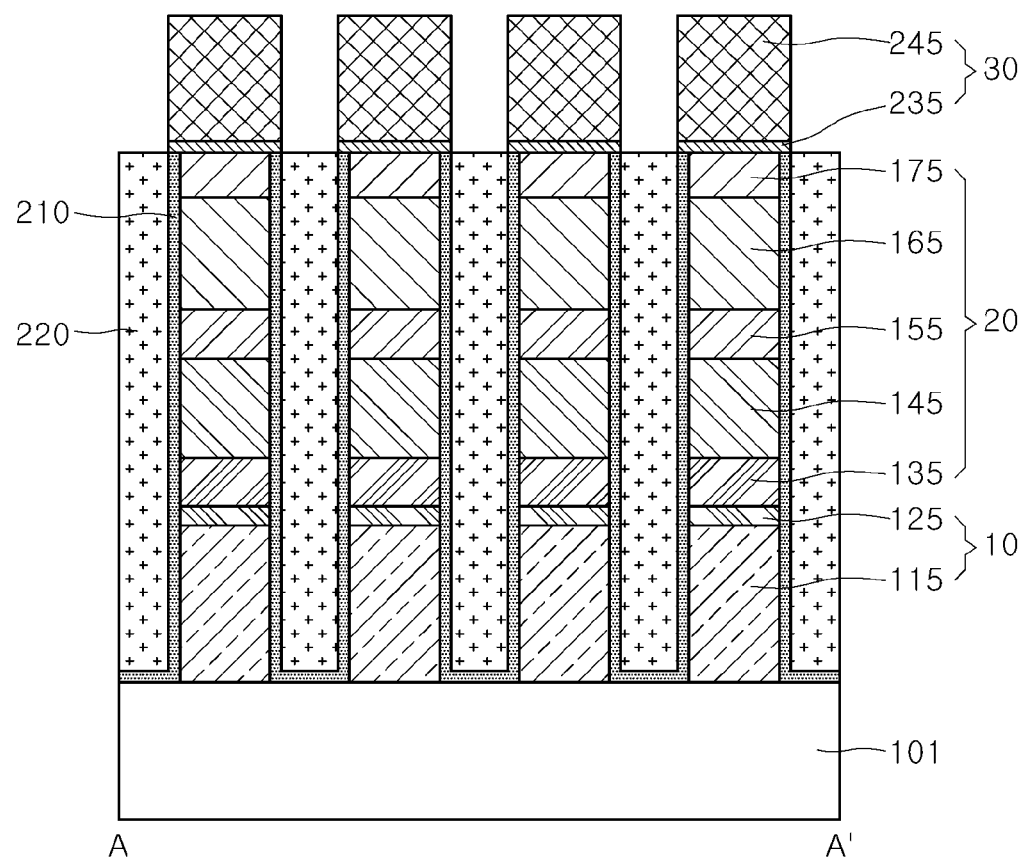
Figure 10C:
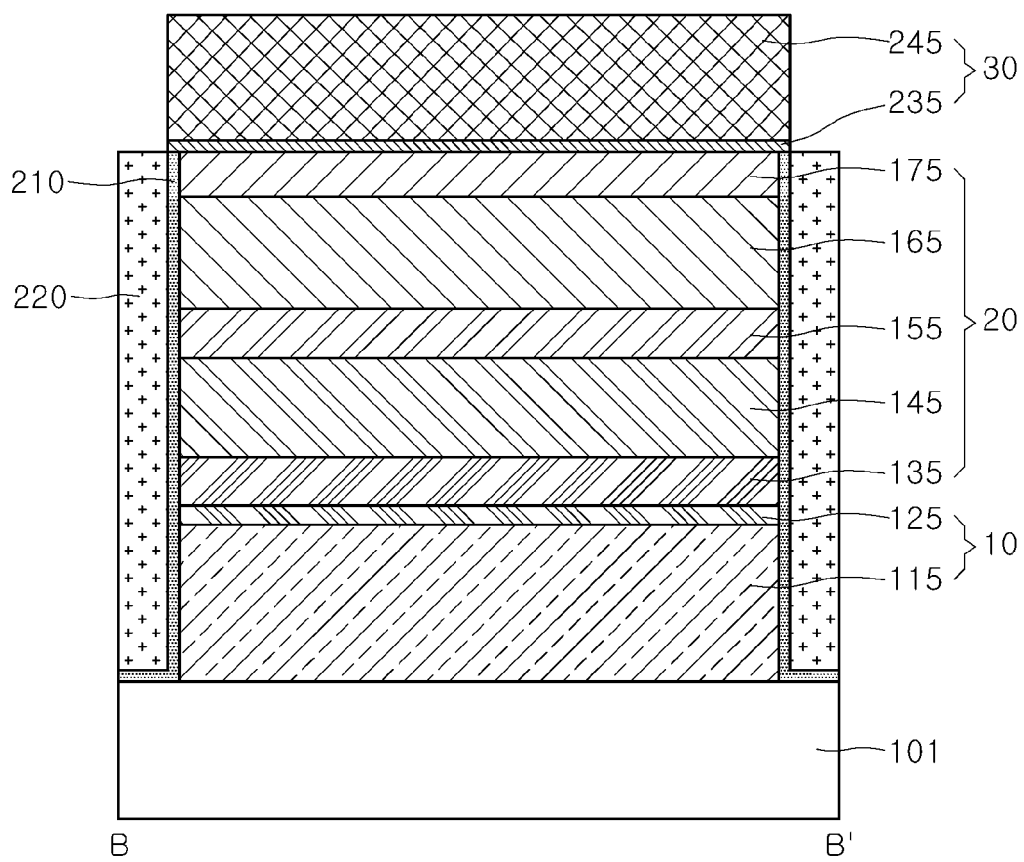

Referring to FIGS. 10A, 10B, and 10C, the heat insulating layer 210 covering the upper surfaces of the third electrode layers 175 of the device pattern structures 20 may be removed to expose the third electrode layers 175. Next, an upper bonding material layer (not shown) and an upper contact material layer (not shown) may be sequentially formed on the third electrode layers 175. The upper bonding material layer and the upper contact material layer may be formed, for example, using a chemical vapor deposition method or an atomic layer deposition method. The upper bonding material layer and the upper contact material layer may be subsequently patterned to form upper contact structures 30. Each of the upper contact structures 30 may include an upper bonding layer 235 and an upper contact pattern 245.

The upper bonding layer 235 may include, for example, metal silicide. The upper contact pattern 245 may include a conductive material. The conductive material may include, for example, doped silicon (Si), tungsten (W), tungsten silicide, tungsten nitride, titanium nitride, tantalum nitride, or a combination of two or more thereof.

A semiconductor device according to an embodiment of the present disclosure may be manufactured using the above-described method.

In some embodiments, an upper conductive line that is electrically connected to the upper contact pattern 245 may be additionally formed on the upper portion of the substrate 101. The upper conductive line may include a conductive material.

In some embodiments, when forming the insulating layer 220 in connection with FIGS. 9A, 9B, and 9C, process conditions such as process pressure, reaction gas partial pressure, and process temperature may be controlled to form air gaps in the insulating layer 220. As a result, as described above with reference to FIG. 5, an insulating layer 222 that includes air gaps (e.g., air gaps 225 of FIG. 5) may be formed.

In some embodiments, when forming the stack structure 1000 in connection with FIGS. 6A, 6B, and 6C, the first electrode material layer 130 and the selecting device material layer 140 may be omitted. Accordingly, the second electrode material layer 150 may be formed on the lower bonding material layer 120. As a result, each of the device pattern structures 20 might not include a selecting device.

In some embodiments, when the stack structure 1000 is formed in connection with FIGS. 6A, 6B, and 6C, a lower conductive line (not shown) may be formed between the substrate 101 and the lower contact material layer 110. Thereafter, when the lower contact structures 10 and the device pattern structures 20 are formed in connection with FIGS. 7A, 7B, and 7C, the lower contact patterns 115 may be formed on the lower conductive line. The lower conductive line may include a conductive material. The lower conductive line may provide a voltage for driving the device pattern structures 20.

In some embodiments, when the stack structure 1000 is formed in connection with FIGS. 6A, 6B, and 6C, the formation order of the selecting device material layer 140 and the phase change material layer 160 may be switched. That is, the phase change material layer 160 is formed between the first electrode material layer 130 and the second electrode material layer 150, and the selecting device material layer 140 may be formed between the second electrode material layer 150 and the third electrode material layer 170. Accordingly, when the device pattern structures 20 are formed in connection with FIGS. 7A, 7B and 7C, the phase change layer 165 may be formed between the first electrode layer 135 and the second electrode layer 155, and the selecting device layer 145 may be formed between the second electrode layer 155 and the third electrode layer 175.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:
1. A semiconductor device comprising:
a substrate;
a device pattern structure disposed over the substrate;
a heat insulating layer disposed on a sidewall surface of the device pattern structure, wherein the heat insulating layer includes a metal-organic framework; and
an insulating layer disposed over the substrate, wherein the insulating layer includes an insulating material different from the metal-organic framework and contacts the heat insulating layer in a lateral direction.

2. The semiconductor device of claim 1, wherein the device pattern structure includes:
   a first electrode layer over the substrate;
   a phase change layer disposed on the first electrode layer; and
   a second electrode layer disposed on the phase change layer.

3. The semiconductor device of claim 2, wherein the device pattern structure further includes:
   a third electrode layer disposed between the substrate and the first electrode layer or over the second electrode layer; and
   a selecting device layer disposed between the first electrode layer and the third electrode layer, or between the second electrode layer and the third electrode layer.

4. The semiconductor device of claim 1, wherein the device pattern structure includes a pillar structure extending in a direction substantially perpendicular to a surface of the substrate.

5. The semiconductor device of claim 4, wherein the heat insulating layer is disposed to surround an outer circumferential surface of the pillar structure.

6. The semiconductor device of claim 1, wherein the metal-organic framework has a porous structure.

7. The semiconductor device of claim 1, wherein the metal-organic framework has a heat insulating property.

8. The semiconductor device of claim 7, wherein the metal-organic framework has a thermal conductivity of less than 0.1 W/mK.

9. The semiconductor device of claim 1, further comprising a lower contact structure, disposed between the substrate and the device pattern structure, that has the same cross-sectional area as the device pattern structure.

10. The semiconductor device of claim 9, wherein the heat insulating layer is disposed on a sidewall surfaces of the lower contact structure.

11. The semiconductor device of claim 1, wherein the insulating layer comprises air gaps.

12. A semiconductor device comprising:
    a substrate; and
    a plurality of unit cells disposed over the substrate to be spaced apart from each other,
    wherein each of the plurality of unit cells includes:
    a device pattern structure extending in a direction perpendicular to a surface of the substrate and including a phase change layer;
    a heat insulating layer disposed on a sidewall surface of the device pattern structure, the heat insulating layer including a metal-organic framework; and
    an insulating layer including an insulating material different from the metal-organic framework disposed over the substrate, the insulating layer contacting the heat insulating layer in a lateral direction.

13. The semiconductor device of claim 12,
    wherein the device pattern structure includes a pillar structure, and
    wherein the heat insulating layer is disposed to surround an outer circumferential surface of the pillar structure.

14. The semiconductor device of claim 12, wherein the metal-organic framework has a heat insulating property.

15. The semiconductor device of claim 12, wherein the insulating layer comprises air gaps.

16. A method of manufacturing a semiconductor device, the method comprising:
    providing a substrate;
    sequentially stacking a first electrode material layer, a phase change material layer, and a second electrode material layer over the substrate to form a stack structure;
    selectively etching the stack structure to form a device pattern structure including a first electrode layer, a phase change layer, and a second electrode layer over the substrate;
    forming a heat insulating layer including a metal-organic framework on a sidewall surface of the device pattern structure over the substrate; and
    forming an insulating layer including an insulating material different from the metal-organic framework disposed over the substrate, the insulating layer contacting the heat insulating layer in a lateral direction.

17. The method of claim 16, wherein forming the heat insulating layer includes forming the metal-organic framework by using a first precursor and a second precursor with an atomic layer deposition method or a chemical vapor deposition method, the first precursor including metal constituting a metal node, and the second precursor including an organic ligand.

18. The method of claim 16, wherein forming the heat insulating layer includes:
    synthesizing the metal-organic framework using a first precursor including metal constituting a metal node and a second precursor including an organic ligand; and
    coating the device pattern structure with the synthesized metal-organic framework.

19. The method of claim 16, further comprising:
    forming a lower contact material layer between the substrate and the device pattern structure; and
    patterning the lower contact material layer to form a lower contact pattern over the substrate.

20. The method of claim 19, wherein forming the heat insulating layer further comprises forming the heat insulating layer to cover a side surface of the lower contact pattern over the substrate.

21. The method of claim 16, wherein forming the stack structure further comprises forming a third electrode material layer and a selecting device material layer between the substrate and the first electrode material layer, and
    wherein forming the device pattern structure further comprises selectively etching the third electrode material layer and the selecting device material layer to form a third electrode layer and a selecting device layer.

22. The method of claim 16, wherein forming the stack structure further comprises sequentially forming a selecting device material layer and a third electrode material layer on the second electrode material layer, and
    wherein forming the device pattern structure further includes selectively etching the third electrode material layer and the selecting device material layer to form a third electrode layer and a selecting device layer.

23. The method of claim 16, wherein the metal-organic framework has a porous structure.

24. The method of claim 16, wherein the insulating layer comprises air gaps.

25. The method of claim 16, further comprising:
    forming an upper contact material layer over the device pattern structure; and
    patterning the upper contact material layer to form an upper contact pattern.

26. The method of claim 17, The semiconductor device of claim 1, wherein a thermal conductivity of the heat insulation layer is lower than a thermal conductivity of the insulating layer.

* * * * *